US011453310B2

(12) United States Patent
Kubo et al.

(10) Patent No.: US 11,453,310 B2
(45) Date of Patent: Sep. 27, 2022

(54) DISPLAY DEVICE FOR INDICATING THE DETERIORATION STATE OF A SECONDARY BATTERY AND THE TRAVELABLE DISTANCE OF AN ELECTRIC OR HYBRID VEHICLE

(71) Applicant: TOYOTA JIDOSHA KABUSHIKI KAISHA, Toyota (JP)

(72) Inventors: Kazuki Kubo, Toyota (JP); Junta Izumi, Nagoya (JP); Yoshihiro Uchida, Nagakute (JP); Masaki Uchiyama, Obu (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 459 days.

(21) Appl. No.: 16/569,838

(22) Filed: Sep. 13, 2019

(65) Prior Publication Data

US 2020/0122602 A1    Apr. 23, 2020

(30) Foreign Application Priority Data

Oct. 19, 2018  (JP) .............................. JP2018-197636

(51) Int. Cl.
| | |
|---|---|
| *B60L 58/16* | (2019.01) |
| *G07C 5/00* | (2006.01) |
| *B60K 35/00* | (2006.01) |
| *B60L 53/14* | (2019.01) |
| *B60K 6/28* | (2007.10) |

(52) U.S. Cl.
CPC .............. *B60L 58/16* (2019.02); *B60K 35/00* (2013.01); *G07C 5/004* (2013.01); *B60K 6/28* (2013.01); *B60L 53/14* (2019.02); *B60Y 2200/91* (2013.01); *B60Y 2200/92* (2013.01); *B60Y 2400/112* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,886,527 | A * | 3/1999 | Ito ........................ | G01R 31/392 |
| | | | | 324/426 |
| 2013/0297244 | A1* | 11/2013 | Takatsuji ............. | G01R 31/392 |
| | | | | 702/63 |
| 2018/0050601 | A1 | 2/2018 | Katanoda | |

FOREIGN PATENT DOCUMENTS

| | | | |
|---|---|---|---|
| JP | 2014041768 A | * | 3/2014 |
| JP | 2015-139346 A | | 7/2015 |
| JP | 2018-029430 A | | 2/2018 |

OTHER PUBLICATIONS

Translation of JP-2014041768-A obtained from espace.net (Year: 2014).*

* cited by examiner

*Primary Examiner* — Michael D Lang
(74) *Attorney, Agent, or Firm* — Sughrue Mion, PLLC

(57) ABSTRACT

A display device includes: a display unit configured to display an index corresponding to a deterioration state of a secondary battery and an EV travelable distance; and a control unit configured to control display of the display unit such that a first decreasing amount by which the EV travelable distance displayed on the display unit decreases with the elapse of time until a predetermined condition has been satisfied is less than a second decreasing amount by which the EV travelable distance displayed on the display unit decreases with the elapse of time after the predetermined condition has been satisfied.

4 Claims, 5 Drawing Sheets

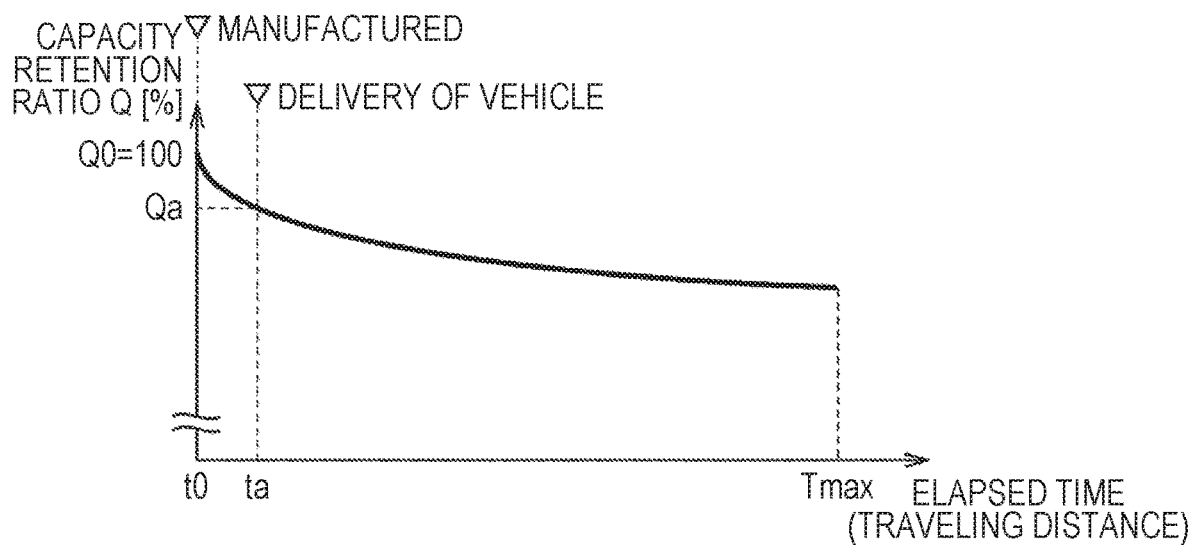
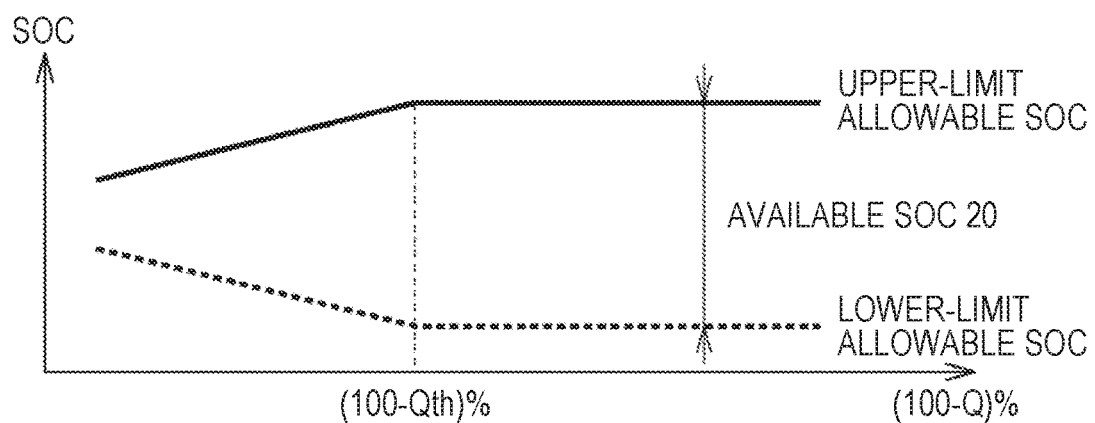

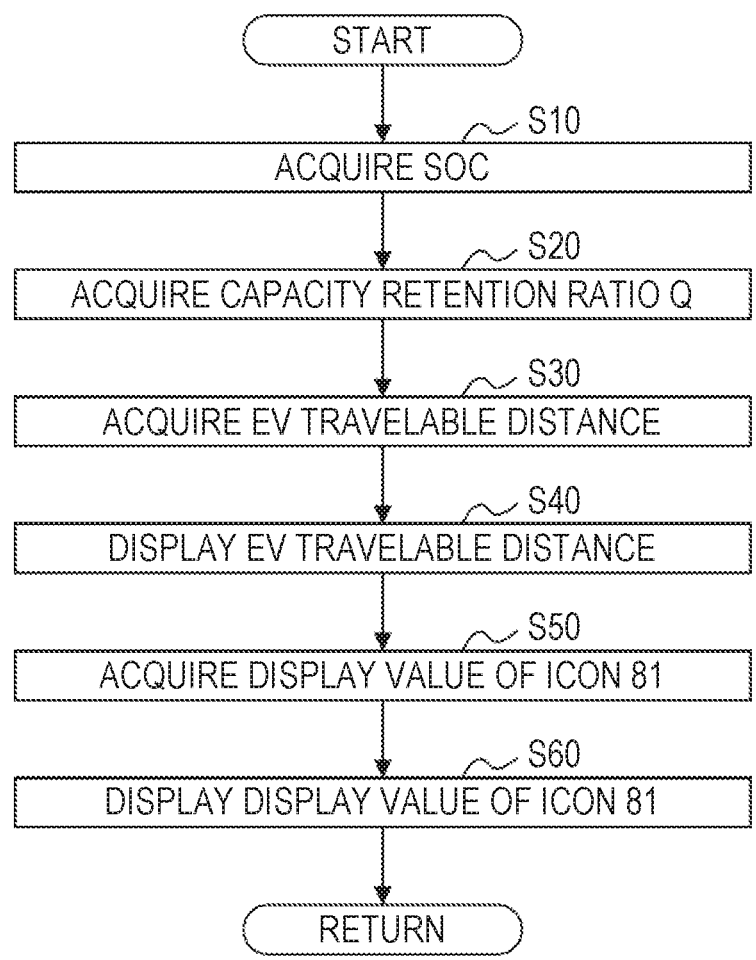

DISPLAY DEVICE FOR INDICATING THE DETERIORATION STATE OF A SECONDARY BATTERY AND THE TRAVELABLE DISTANCE OF AN ELECTRIC OR HYBRID VEHICLE

INCORPORATION BY REFERENCE

The disclosure of Japanese Patent Application No. 2018-197636 filed on Oct. 19, 2018 including the specification, drawings and abstract is incorporated herein by reference in its entirety.

BACKGROUND

1. Technical Field

The present disclosure relates to a display device.

2. Description of Related Art

A secondary battery is mounted as a drive source of a motor in vehicles such as a hybrid vehicle and an electric vehicle. It is known that a secondary battery deteriorates and internal resistance of the secondary battery increases or a full charging capacity of the secondary battery decreases with the elapse of time. Accordingly, various techniques for estimating a deterioration state of a secondary battery have been proposed.

SUMMARY

It is also known that a secondary battery deteriorates quickly in an initial state immediately after being manufactured. Accordingly, when an electric vehicle (EV) travelable distance is gradually decreased according to a deterioration state of a secondary battery, a user of a vehicle is likely to feel a sense of incompatibility due to the quick decrease of the EV travelable distance from a time point at which the vehicle has been purchased.

Therefore, even when time has elapsed after a vehicle has been manufactured, it is conceivable that an EV traveling distance does not decrease and a display value of the EV travelable distance does not decrease until a capacity retention ratio indicating a deterioration state of a secondary battery becomes less than a predetermined value. Specifically, until the capacity retention ratio reaches the predetermined value, an available state of charge (SOC) range in which the vehicle can execute EV traveling becomes gradually broader as the capacity retention ratio decreases. In the vehicle, when the capacity retention ratio becomes equal to or greater than the predetermined value, an upper limit value and a lower limit value of an available SOC are fixed.

In the vehicle, until the capacity retention ratio reaches the predetermined value after the vehicle has been manufactured, for example, the EV travelable distance in a fully charged state does not decrease and the EV travelable distance in a fully charged state starts decreasing after a period in which the capacity retention ratio reaches the predetermined value has passed.

In the above-mentioned vehicle, it is assumed that a deterioration state of a secondary battery is acquired and an index indicating the capacity retention ratio of the secondary battery is displayed on a display unit without any change. At this time, when the capacity retention ratio of the secondary battery is greater than the predetermined value, a driver may feel a sense of incompatibility because the EV travelable distance in the fully charged state does not decrease but the index indicating the capacity retention ratio decreases.

The present disclosure curbs a user's feeling of a sense of incompatibility due to an EV travelable distance and a capacity retention ratio in a display device of a vehicle in which a decrease in a display value of the EV travelable distance is curbed until a capacity retention ratio indicating a deterioration state of a secondary battery becomes less than the predetermined value.

According to an aspect of the present disclosure, there is provided a display device including: a display unit configured to display an index corresponding to a deterioration state of a secondary battery and an EV travelable distance; and a control unit configured to control display of the display unit such that (a) a first decreasing amount by which the EV travelable distance displayed on the display unit decreases with the elapse of time until a predetermined condition has been satisfied is less than a second decreasing amount by which the EV travelable distance displayed on the display unit decreases with the elapse of time after the predetermined condition has been satisfied and (b) a first changing amount by which the index changes with the elapse of time until the predetermined condition has been satisfied is less than a second changing amount by which the index changes with the elapse of time after the predetermined condition has been satisfied.

In the display device, changing amounts by which the index indicating the deterioration state of the secondary battery and the EV travelable distance change until the predetermined condition has been satisfied are small and the changing amounts become greater when the predetermined condition has been satisfied. In this way, behavior of the index indicating the deterioration state of the secondary battery and behavior of the EV travelable distance interlink with each other and it is possible to suppress a user from feeling a sense of incompatibility.

The predetermined condition may be that the deterioration state of the secondary battery becomes a predetermined deterioration state. The deterioration state of the secondary battery may be set based on a capacity retention ratio of the secondary battery. With the display device according to the present disclosure, it is possible to curb a user's feeling a sense of incompatibility due to an EV travelable distance and a capacity retention ratio.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 3 is a graph illustrating an example of a temporal change of a capacity retention ratio Q of a battery 60;

FIG. 4 is a graph illustrating a relationship between (100-capacity retention ratio Q) % and an available state of charge (SOC);

FIG. 7 is a flowchart illustrating a control flow of setting an electric vehicle (EV) travelable distance and the display value of the icon 81.

DETAILED DESCRIPTION OF EMBODIMENTS

A vehicle according to an embodiment will be described below with reference to FIGS. 1 to 7. In the configurations illustrated in FIGS. 1 to 7, the same or substantially the same elements will be referred to by the same reference signs and description thereof will not be repeated.

Figure 1:
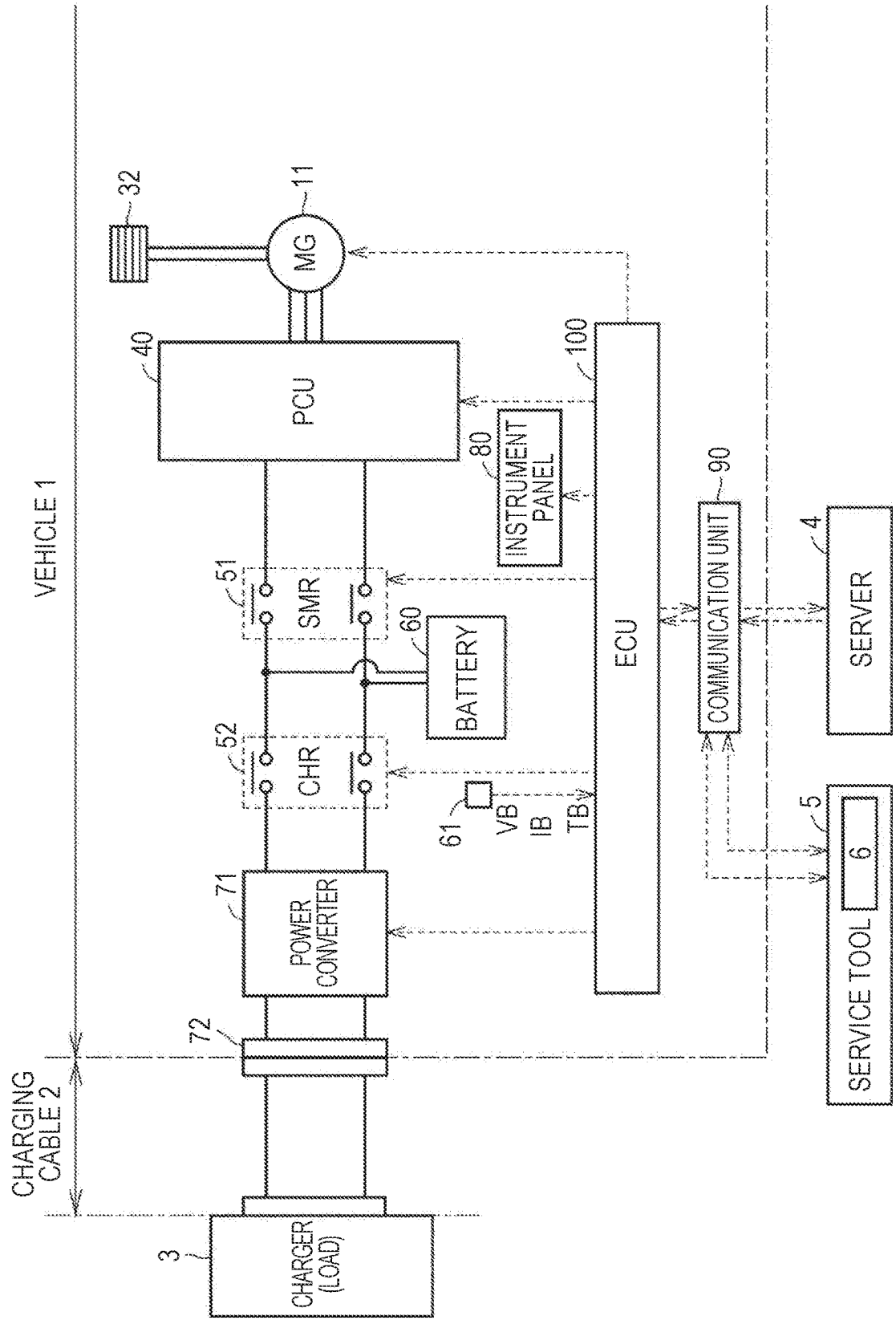
FIG. 1 is a diagram illustrating an overall configuration of a system including a vehicle according to a first embodiment.

FIG. 1 is a diagram schematically illustrating an overall configuration of a system including a vehicle according to an embodiment. Referring to FIG. 1, a vehicle 1 is configured to be able to be electrically connected to a charger 3 (which may be a load outside the vehicle) via a charging cable 2 and is configured to communicate with a server 4 or a service tool 5 outside the vehicle. The server 4 receives a variety of information from the vehicle 1 or performs calculation based on the received information and transmits the result of calculation to the vehicle 1. The service tool 5 acquires a variety of information via a communication unit 90 and displays a display value of an electric vehicle (EV) travelable distance or a display value corresponding to a deterioration state of a battery 60 on a display unit 6.

The vehicle 1 includes a motor generator 11, a driving wheel 32, a power control unit (PCU) 40, a system main relay (SMR) 51, a charging relay 52, a battery 60, a monitoring unit 61, a power converter 71, an inlet 72, an instrument panel 80, a communication unit 90, an electronic control unit (ECU) 100.

The motor generator 11 is, for example, a three-phase alternating current (AC) rotary electric machine in which a permanent magnet is embedded in a rotor (not illustrated). A drive shaft thereof is rotated with electric power from the battery 60. The motor generator 11 can also generate electric power by regenerative braking. AC power which is generated by the motor generator 11 is converted into direct current (DC) power by the PCU 40 and is charged in the battery 60.

The PCU 40 converts DC power stored in the battery 60 into AC power and supplies the AC power to the motor generator 11 in accordance with a control signal from the ECU 100. The PCU 40 converts AC power generated by the motor generator 11 into DC power and supplies the DC power to the battery 60.

The SMR 51 is electrically connected to a power line connecting the PCU 40 to the battery 60. The SMR 51 switches between supply and interception of electric power between the PCU 40 and the battery 60 in accordance with a control signal from the ECU 100.

The charging relay 52 is electrically connected to a power line which connects the battery 60 to the power converter 71. The charging relay 52 switches between supply and interception of electric power between the battery 60 and the power converter 71 in accordance with a control signal from the ECU 100.

The battery 60 is a DC power supply which is configured to be chargeable and dischargeable. A secondary battery such as a lithium-ion secondary battery or a nickel-hydride battery can be used as the battery 60. The battery 60 supplies electric power for generating a driving force for the vehicle 1 to the PCU 40. The battery 60 also stores electric power which is generated by the motor generator 11.

The monitoring unit 61 monitors a state of the battery 60. Specifically, the monitoring unit 61 includes a voltage sensor that detects a voltage VB of the battery 60, a current sensor that detects a current IB which is input to and output from the battery 60, and a temperature sensor that detects a temperature TB of the battery 60 (none of which is illustrated). The sensors output signals indicating results of detection thereof to the ECU 100.

The power converter 71 includes, for example, an AC/DC converter (not illustrated) and serves to convert AC power which is supplied from the charger 3 via the charging cable 2 and the inlet 72 into DC power and to output the DC power to the charging relay 52.

The instrument panel 80 is a display device (a gauge board) in which meters are installed that notifies a user of various states of the vehicle 1 under the control of the ECU 100.

The communication unit 90 is configured to perform interactional communication with the server 4 in a wired or wireless manner. The ECU 100 includes a central processing unit (CPU), a memory, and an input and output port (none of which are illustrated). The ECU 100 outputs control signals based on input of signals from various sensors and maps and programs stored in the memory, and controls the devices such that the vehicle 1 reaches a desired state. In this embodiment, an example of principal control which is executed by the ECU 100 is a process of displaying a deterioration state of the battery 60 on the instrument panel 80 and details thereof will be described later.

In the vehicle 1 having the above-mentioned configuration, when a full charging capacity of the battery 60 decreases, a distance in which the vehicle 1 can travel (an EV travelable distance) decreases.

Figure 2:
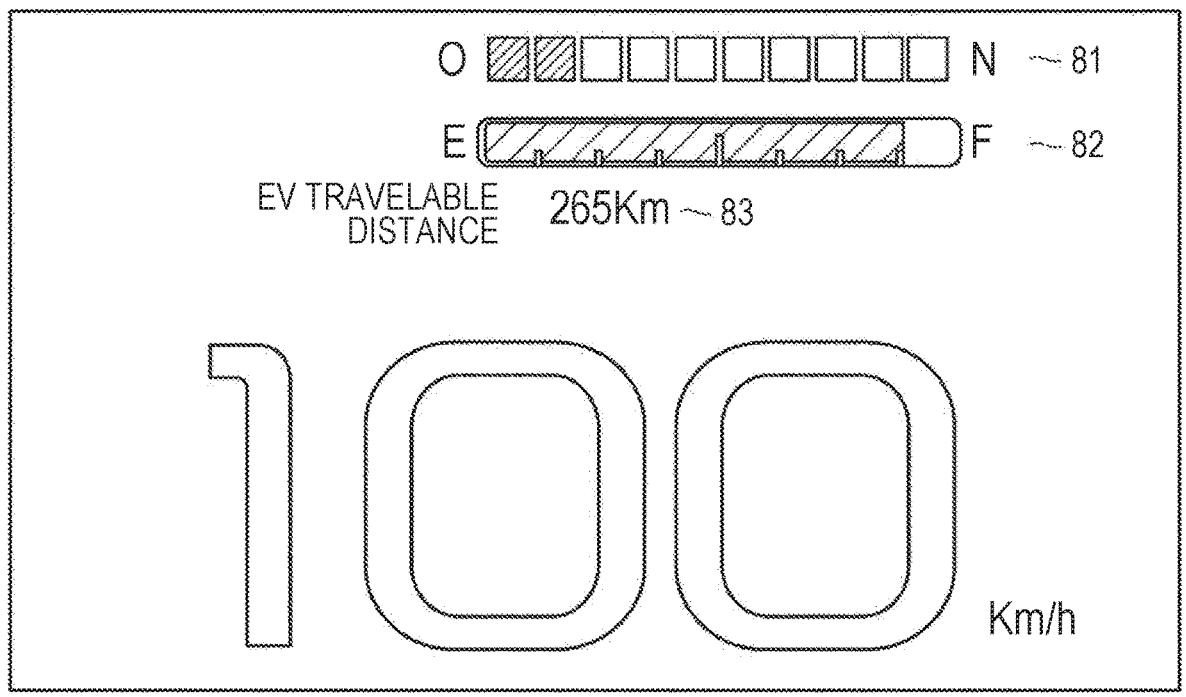
FIG. 2 is a diagram illustrating an example of a display mode of an instrument panel 80.

FIG. 2 is a diagram illustrating an example of a display mode of the instrument panel 80. As illustrated in FIG. 2, a speed per hour (for example, 100 km/h) of the vehicle 1 is displayed on the instrument panel 80. In addition, the instrument panel 80 is configured to display an icon (a meter) 81 indicating a number corresponding to a capacity retention ratio of the battery 60 and an icon 82 indicating a state of charge of the battery 60 as shown in the right uppermost part of FIG. 2. The instrument panel 80 is also configured to display a numerical value indicating an EV travelable distance on the display area 83. In the example illustrated in FIG. 2, the number of icons in a state in which the battery 60 has not deteriorated at all is 10 and the number of icons decreases as deterioration of the battery 60 progresses. That is, the number of icons is an index indicating the deterioration state of the battery 60.

The icon 82 indicates a charging state of the battery 60. For example, the icon 82 is a value indicating a current state of charge (SOC) by percentage when the ECU 100 sets an upper-limit allowable SOC which will be described later to 100% and sets a lower-limit allowable SOC to 0%. The numerical value displayed on the display area 83 is a value indicating a distance in which the vehicle can execute EV traveling with the current SOC.

FIG. 3 is a diagram illustrating an example of a temporal change of the capacity retention ratio Q of the battery 60. In FIG. 3, the horizontal axis represents an elapsed time after the vehicle 1 has been manufactured (which is indicated by t0). There, the horizontal axis may be replaced with a traveling distance of the vehicle 1. The vertical axis represents the capacity retention ratio Q of the battery 60. The deterioration state of the battery 60 indicates a state in which the battery 60 deteriorates less as the capacity retention ratio Q increases and a state in which the battery 60 deteriorates more as the capacity retention ratio Q decreases.

The EV travelable distance is a distance by which the vehicle 1 can travel when the motor generator 11 is driven with only electric power from the battery 60. When the vehicle 1 is a plug-in hybrid vehicle, the EV travelable distance is a distance in which the vehicle 1 can travel when the motor generator is driven with only electric power from the battery without using a driving force from an engine.

The capacity retention ratio Q of the battery 60 can be calculated using a known method. More specifically, the SOC of the battery 60 is estimated two times and a charged/discharged power ΔAh which is charged in or discharged from the battery 60 between the two estimations of the SOC is measured by current integration using a current sensor. In this case, the ECU 100 can calculate a full charging capacity C of the battery 60 using Equation (1) based on the estimation results S1 and S2 of the two estimations of the SOC and the charged/discharged power ΔAh.

$$C=\Delta Ah/(S1-S2)\times 100 \quad (1)$$

The capacity retention ratio Q of the battery 60 is calculated by dividing the full charging capacity C calculated using Equation (1) by an initial value C0 of the full charging capacity (for example, a value at a time point at which the traveling distance D reaches a reference distance Db) of the battery 60 (see Equation (2)).

$$Q=C/C0\times 100 \quad (2)$$

As illustrated in FIG. 3, a progress speed of deterioration of a battery is the highest immediately after it has been manufactured. When the EV travelable distance is calculated based on the capacity retention ratio Q, the EV travelable distance markedly decreases immediately after the vehicle has been delivered. For example, when a user repeatedly gets on the vehicle in a fully charged state, a difference between the EV travelable distance in the previous fully charged state and the EV travelable distance in the current fully charged state is great and a user is likely to feel a marked decrease of the EV travelable distance in the fully charged state. As a result, although the vehicle 1 has been purchased as a new vehicle, a user may feel a sense of incompatibility such as that the battery 60 may be defective because the EV travelable distance immediately decreases markedly.

Therefore, in the vehicle 1 according to this embodiment, for example, control is executed such that the EV travelable distance in the fully charged state is constant until the capacity retention ratio Q reaches a predetermined value Qth, and control is executed such that the EV travelable distance in the fully charged state is calculated based on the capacity retention ratio Q when the capacity retention ratio Q becomes equal to or less than the predetermined value Qth.

The predetermined value Qth is a capacity retention ratio Q when the deterioration state of the battery 60 has reached a predetermined deterioration state.

Accordingly, even when time elapses after the vehicle 1 has been manufactured, a decreasing amount by which the EV travelable distance decreases with the elapse of time is decreased until the capacity retention ratio Q reaches the predetermined value Qth and thus it is possible to curb a user's feeling of a sense of incompatibility.

A changing amount by which the number of icons 81 illustrated in FIG. 2 decreases with the elapse of time until the capacity retention ratio Q reaches the predetermined value Qth is less than the changing amount by which the number of icons 81 decreases with the elapse of time after the capacity retention ratio Q has reached the predetermined value Qth. That is, the number of icons 81 is not likely to decrease unless the vehicle 1 travels until the capacity retention ratio Q reaches the predetermined value Qth.

Accordingly, when a user performs charging and repeatedly gets on the vehicle 1 in a fully charged state until the capacity retention ratio Q reaches the predetermined value Qth, the decreasing amount of the EV travelable distance in the fully charged state is small and thus a user has an impression that the deterioration of the battery 60 has not progressed. Since the decreasing amount of the icons 81 is small, the user is likely to have an impression that the deterioration of the battery 60 has not progressed from the display of the icons 81. In this way, it is possible to suppress occurrence of a difference between the impression which a user has for the deterioration state of the battery 60 based on the icons 81 and the impression which the user has for the deterioration state of the battery 60 based on the EV travelable distance.

A method of calculating the EV travelable distance will be described below. FIG. 4 is a graph illustrating a relationship between (100-capacity retention ratio Q) % and an available SOC. Data indicating a relationship between (100-capacity retention ratio Q) % and the available SOC illustrated in FIG. 4 is stored in the ECU 100. In the graph, the horizontal axis represents (100-capacity retention ratio Q) % and the vertical axis represents the SOC of the battery 60.

When the battery 60 deteriorates due to aging and the capacity retention ratio Q decreases, (100-capacity retention ratio Q) % increases.

The solid line in the graph indicates an upper-limit allowable SOC and a dotted line indicates a lower-limit allowable SOC. An available SOC 20 indicates a gap between the upper-limit allowable SOC and the lower-limit allowable SOC. The upper-limit allowable SOC is, for example, an SOC when the ECU 100 determines that the battery 60 is fully charged at the time of charging. The ECU 100 allows the vehicle 1 to perform EV traveling within the available SOC 20.

When the value of (100-capacity retention ratio Q) % is small, it means that the capacity retention ratio Q is 100% or close to 100% and that deterioration of the battery 60 has not progressed. When the value of (100-capacity retention ratio Q) % is large, it means that the capacity retention ratio Q is small and the deterioration of the battery 60 progresses.

When the value of (100-capacity retention ratio Q) is less than a value of (100-predetermined value Qth), the upper-limit allowable SOC is set to increase as the value of (100-capacity retention ratio Q) increases. When the value of (100-capacity retention ratio Q) is equal to or greater than the value of (100-predetermined value Qth), the upper-limit allowable SOC is set to a constant value.

When the value of (100-capacity retention ratio Q) is less than the value of (100-predetermined value Qth), the lower-limit allowable SOC is set to decrease as the value of (100-capacity retention ratio Q) increases. When the value of (100-capacity retention ratio Q) is equal to or greater than the value of (100-predetermined value Qth), the lower-limit allowable SOC is set to a constant value.

Accordingly, the available SOC 20 increases as the value of (100-capacity retention ratio Q) increases when the value of (100-capacity retention ratio Q) is less than the value of (100-predetermined value Qth). When the value of (100-capacity retention ratio Q) is equal to or greater than the value of (100-predetermined value Qth), the available SOC 20 is maintained at a constant value.

When the EV travelable distance is calculated, the ECU 100 first acquires a current capacity retention ratio Q and a current SOC.

The ECU 100 derives the lower-limit allowable SOC from the current capacity retention ratio Q and data illustrated in FIG. 4. Then, the ECU 100 calculates the EV travelable distance at the current time point from the difference between the current SOC and the lower-limit allowable SOC and the capacity retention ratio Q. Specifically, the ECU 100 calculates a virtual EV travelable distance when the battery 60 has not deteriorated from the difference between the current SOC and the lower-limit allowable SOC and calculates an EV travelable distance by multiplying the calculated virtual EV travelable distance by the capacity retention ratio Q. The ECU 100 displays the calculated EV travelable distance on the display area 83 illustrated in FIG. 2.

By setting the EV travelable distance as described above, when the value of (100-capacity retention ratio Q) is less than the value of (100-predetermined value Qth), the available SOC 20 increases even when the capacity retention ratio Q decreases (even when the deterioration of the battery 60 has progressed), and thus the EV travelable distance in the fully charged state is maintained to be constant. That is, even when time has elapsed after the vehicle 1 has been delivered, it is possible to prevent the EV travelable distance in the fully charged state from decreasing. Therewith, even when time has elapsed after the vehicle 1 has been delivered, it is possible to prevent the display value of the EV travelable distance which is displayed on the instrument panel or the like from decreasing.

When the value of (100-capacity retention ratio Q) is equal to or greater than the value of (100-predetermined value Qth), the available SOC 20 is constant as the capacity retention ratio Q increases and thus the EV travelable distance in the fully charged state decreases.

Accordingly, for example, when a predetermined period elapses after the vehicle has been delivered and the deterioration of the battery 60 progresses to a certain extent, the EV travelable distance in the fully charged state decreases with the elapse of time.

In this way, a decreasing amount by which the EV travelable distance in the fully charged state decreases with the elapse of time until the deterioration state of the battery 60 reaches a predetermined deterioration state is less than a decreasing amount by which the EV travelable distance in the fully charged state decreases with the elapse of time after the deterioration state of the battery 60 has reached the predetermined deterioration state.

Figure 5:
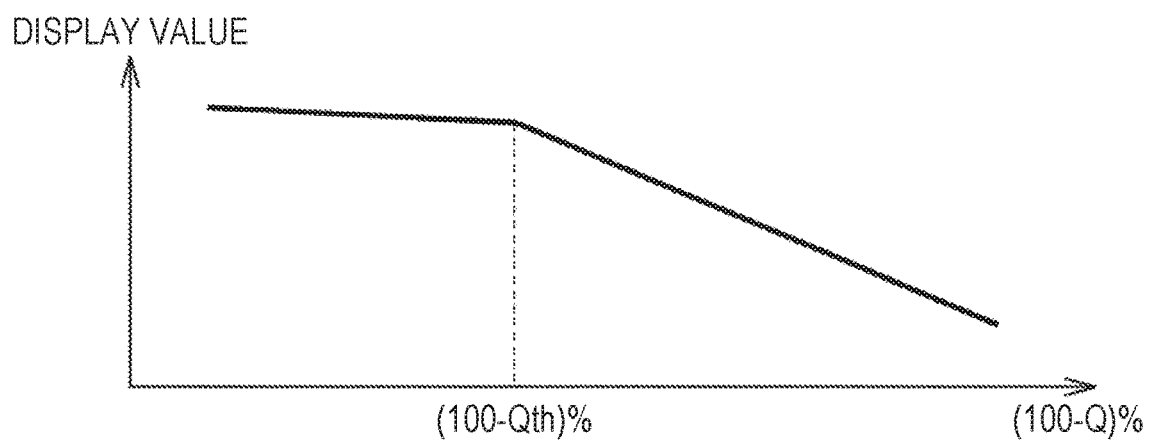
FIG. 5 is a graph illustrating a relationship between a display value of an icon 81 and (100-capacity retention ratio Q) %.

A method of setting a display value of the icon 81 will be described below. FIG. 5 is a graph illustrating a relationship between the display value of the icon 81 and the value of (100-capacity retention ratio Q). The vertical axis in the graph represents the display value of the icon 81 and the horizontal axis represents the value of (100-capacity retention ratio Q). The display value of the icon 81 is the number of icons 81 illustrated in FIG. 2 in this embodiment. Data corresponding to the graph illustrated in FIG. 5 is stored in the ECU 100.

When the value of (100-capacity retention ratio Q) is less than the value of (100-predetermined value Qth), a decreasing amount of the display value of the icon 81 decreases as the value of (100-capacity retention ratio Q) increases.

When the value of (100-capacity retention ratio Q) is equal to or greater than the value of (100-predetermined value Qth), the decreasing amount of the display value of the icon 81 increases as the value of (100-capacity retention ratio Q) increases.

That is, as the value of (100-capacity retention ratio Q) increases, the decreasing amount of the display value of the icon 81 when the value of (100-capacity retention ratio Q) is less than the value of (100-predetermined value Qth) is less than that when the value of (100-capacity retention ratio Q) is equal to or greater than the value of (100-predetermined value Qth).

Here, the time at which the value of (100-capacity retention ratio Q) reaches the value of (100-predetermined value Qth) is a time at which a predetermined period has elapsed after the battery 60 has been manufactured. Therefore, the change of the display value of the icon 81 illustrated in FIG. 5 with respect to the elapsed time will be described below.

Figure 6:
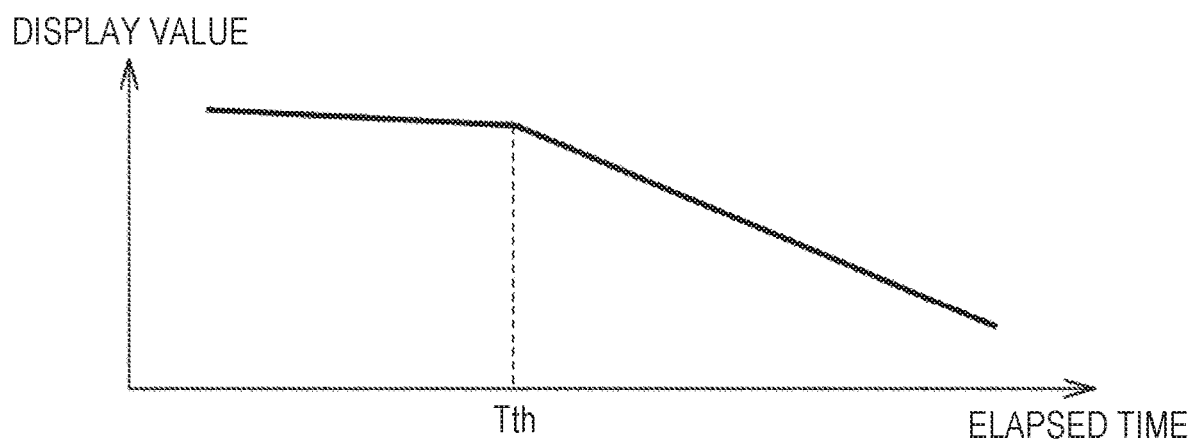
FIG. 6 is a graph illustrating a relationship between a display value of an icon 81 and an elapsed time.

FIG. 6 is a graph illustrating a relationship between the display value of the icon 81 and the elapsed time. The elapsed time is an elapsed time which has elapsed after the battery 60 has been manufactured.

A "predetermined time Th" illustrated on the horizontal axis means a time at which the capacity retention ratio Q reaches the predetermined value Qth. That is, when the elapsed time is the predetermined time Th, it means that the deterioration state of the battery 60 reaches a predetermined deterioration state.

As illustrated in FIG. 6, the decreasing amount by which the display value of the icon 81 decreases with the elapse of time until the deterioration state of the battery 60 reaches a predetermined deterioration state is less than a changing amount by which the display value of the icon 81 changes with the elapse of time after the deterioration state of the battery 60 has reached the predetermined deterioration state.

As described above, any of the decreasing amount of the EV travelable distance and the decreasing amount of the display value of the icon 81 until the deterioration state of the battery 60 reaches the predetermined deterioration state is less than that after the deterioration state of the battery 60 reaches the predetermined deterioration state.

That is, in the vehicle 1 according to his embodiment, even when time elapses after the vehicle has been delivered, it is possible to prevent the EV travelable distance in the fully charged state and the numerical value displayed on the display area 83 of the instrument panel 80 from decreasing and to prevent the display value of the icon 81 indicating the deterioration state of the battery 60 from decreasing. When the deterioration state of the battery 60 reaches the predetermined deterioration state, both the numerical value displayed on the display area 83 of the instrument panel 80 and the display value of the icon 81 start decreasing. Accordingly, in the vehicle 1, the EV travelable distance and the changing mode of the icon 81 interlink with each other and it is possible to prevent a user from feeling a sense of incompatibility due to the numerical value of the display area 83 indicating the EV travelable distance and the display value of the icon 81.

A control flow in the ECU 100 of the vehicle 1 will be described below. FIG. 7 is a flowchart illustrating a control flow of setting an EV travelable distance and a display value of the icon 81.

The ECU 100 acquires a current SOC of the battery 60 (Step 10). Various methods can be employed as a method of calculating an SOC of the battery 60 and the SOC may be calculated, for example, from an amount of current which is input to and output from the battery 60.

The monitoring unit 61 may detect the current IB which is input to and output from the battery 60 and the temperature TB of the battery 60, transmit information on the current IB and the temperature TB to the server 4, and acquire the SOC which is calculated by the server 4.

The ECU 100 acquires the capacity retention ratio Q (Step 20). The capacity retention ratio Q can be calculated using Equation (1) and Equation (2).

As a method of allowing the ECU 100 to acquire the capacity retention ratio Q, a method of transmitting information on the current IB and the temperature TB to the server 4 and receiving the capacity retention ratio Q calculated by the server 4 may be employed.

Then, the ECU 100 acquires the EV travelable distance (Step 30). Data corresponding to the graph illustrated in FIG. 4 is stored in the ECU 100, and the EV travelable distance at the current SOC is calculated from the data and the capacity retention ratio Q acquired in Step 20. The data illustrated in FIG. 4 may be stored in the server 4 and the EV travelable distance may be acquired from the server 4 via the communication unit 90.

The ECU 100 displays the EV travelable distance (Step 40). Specifically, the ECU 100 displays the EV travelable distance acquired in Step 30 on the display area 83.

The ECU 100 acquires the display value of the icon 81 (Step 50). Specifically, the ECU 100 calculates the display value of the icon 81 based on the capacity retention ratio Q acquired in Step 20 and the data corresponding to the graph illustrated in FIG. 5. The data corresponding to the graph illustrated in FIG. 5 may be stored in the server 4 and the display value of the icon 81 may be acquired from the server 4.

The ECU 100 displays the display value of the icon 81 (Step 60). Specifically, the ECU 100 controls the instrument panel 80 such that the display value set in Step 60 is displayed.

In the above-mentioned embodiment, an example in which the icon 81 is employed as an index indicating the deterioration state of the battery 60 has been described above, but a numerical value may be displayed instead of the icon 81. In the above-mentioned embodiment, the numerical value indicating the EV travelable distance and the icon 81 serving as an index of the deterioration state of the battery 60 which are displayed on the display area 83 of the instrument panel 80 have been described above, but the same may be applied to a display unit 6 which is provided in the service tool 5.

The embodiment disclosed herein is exemplary in all respects but is not restrictive. The scope of the disclosure is defined by the appended claims, and is intended to include all modifications within meanings and scopes equivalent to the claims.

What is claimed is:

1. A display device comprising:
a display unit configured to display an index corresponding to a deterioration state of a secondary battery and an EV travelable distance; and
a control unit configured to control display of the display unit such that (a) a first decreasing amount by which the EV travelable distance displayed on the display unit decreases with an elapse of time until a predetermined condition has been satisfied is less than a second decreasing amount by which the EV travelable distance displayed on the display unit decreases with the elapse of time after the predetermined condition has been satisfied and (b) a first changing amount by which the index changes with the elapse of time until the predetermined condition has been satisfied is less than a second changing amount by which the index changes with the elapse of time after the predetermined condition has been satisfied.

2. The display device according to claim 1, wherein the predetermined condition is that the deterioration state of the secondary battery becomes a predetermined deterioration state.

3. The display device according to claim 1, wherein the deterioration state of the secondary battery is set based on a capacity retention ratio of the secondary battery.

4. A display device comprising:
a display configured to display an index corresponding to a deterioration state of a secondary battery and an EV travelable distance; and
an electronic control unit (ECU) including a processor and a memory, programmed to:
control the display such that (a) a first decreasing amount by which the EV travelable distance displayed on the display decreases with an elapse of time until a predetermined condition has been satisfied is less than a second decreasing amount by which the EV travelable distance displayed on the display decreases with the elapse of time after the predetermined condition has been satisfied and (b) a first changing amount by which the index changes with the elapse of time until the predetermined condition has been satisfied is less than a second changing amount by which the index changes with the elapse of time after the predetermined condition has been satisfied.

* * * * *